(12) United States Patent
Yano

(10) Patent No.: US 11,348,981 B2
(45) Date of Patent: May 31, 2022

(54) IMAGE LIGHT GENERATION DEVICE AND IMAGE DISPLAY DEVICE

(71) Applicant: SEIKO EPSON CORPORATION, Tokyo (JP)

(72) Inventor: Kunihiko Yano, Shiojiri (JP)

(73) Assignee: SEIKO EPSON CORPORATION, Tokyo (JP)

( * ) Notice: Subject to any disclaimer, the term of this patent is extended or adjusted under 35 U.S.C. 154(b) by 0 days.

(21) Appl. No.: 17/037,636

(22) Filed: Sep. 29, 2020

(65) Prior Publication Data

US 2021/0098545 A1 Apr. 1, 2021

(30) Foreign Application Priority Data

Sep. 30, 2019 (JP) .............................. JP2019-178190

(51) Int. Cl.
| | |
|---|---|
| *H01L 29/18* | (2006.01) |
| *H01L 21/00* | (2006.01) |
| *H01L 27/32* | (2006.01) |
| *H01L 51/52* | (2006.01) |

(52) U.S. Cl.
CPC ...... *H01L 27/3232* (2013.01); *H01L 51/5265* (2013.01)

(58) Field of Classification Search
CPC .......... H01L 51/5265; G02B 5/04; G02B 5/20
USPC ...................... 438/31–32, 69; 257/88–89, 98
See application file for complete search history.

(56) References Cited

U.S. PATENT DOCUMENTS

| | | | | |
|---|---|---|---|---|
| 8,040,611 | B2 * | 10/2011 | Saita | .................... G02B 27/145 |
| | | | | 359/634 |
| 10,437,008 | B2 * | 10/2019 | Saita | ........................ G02B 5/04 |
| 2009/0033876 | A1 * | 2/2009 | Shimaoka | .......... G03B 21/2033 |
| | | | | 353/31 |
| 2011/0109820 | A1 * | 5/2011 | Silverstein | ........... H04N 9/3161 |
| | | | | 349/8 |

FOREIGN PATENT DOCUMENTS

| | | | | |
|---|---|---|---|---|
| JP | H0475017 | | 3/1992 | |
| JP | 2012237832 | | 12/2012 | |
| JP | 2016170301 | | 9/2016 | |
| JP | 6913162 | * | 4/2018 | ............... G02B 5/04 |
| JP | 2019023692 | | 2/2019 | |
| WO | 2016147578 | | 9/2016 | |

* cited by examiner

*Primary Examiner* — Calvin Lee
(74) *Attorney, Agent, or Firm* — JCIPRNET

(57) ABSTRACT

An image light generation device of the present disclosure includes first to third display elements configured to emit first to third color light, respectively, and a color synthesis element configured to synthesize the first to third color light. The color synthesis element includes first to third prisms, a first dichroic film configured to reflect the first color light and transmit the second and third color light, and a second dichroic film configured to reflect the second color light and transmit the third color light. The first and second prisms are joined together through a first dichroic film with no air layer therebetween, the second and third prisms are joined together through a second dichroic film with no air layer therebetween, and the main light beam incidence angle of the third color light to the second dichroic film is 40 degrees or greater.

9 Claims, 7 Drawing Sheets

IMAGE LIGHT GENERATION DEVICE AND IMAGE DISPLAY DEVICE

The present application is based on, and claims priority from JP Application Serial Number 2019-178190, filed Sep. 30, 2019, the disclosure of which is hereby incorporated by reference herein in its entirety.

BACKGROUND

1. Technical Field

The present disclosure relates to an image light generation device and an image display device.

2. Related Art

In an image display device such as a head-mounted display and a projector, a color synthesis element that synthesizes a plurality of color light beams of different colors and emits synthetic light beam is known. JP-A-2019-23692 discloses a projector that includes a color synthesis element configured to synthesize red light, green light, and blue light. JP-A-2019-23692 discloses use of a cross dichroic prism, a Philips prism, or a gapless prism as a color synthesis element.

Of the color synthesis prisms disclosed in JP-A-2019-23692, the cross dichroic prism can minimize the optical path length and size of the prism, and therefore can contribute to the miniaturization of the image display device. However, the cross dichroic prism has a configuration in which four triangular columnar prisms are joined to each other, and a linear joining portion where the apexes of the four triangular columnar prisms are joined to each other is formed at the center of the prism. As a result, in a projector provided with this prism, a center line is visually recognized as a part where an image is missing at the center of an image.

Even when the four triangular columnar prisms are joined to each other after the apexes of the triangular columnar prisms are highly precisely formed, a gap corresponding to the sum of the thicknesses of the dichroic film and the adhesive layer is formed, and accordingly a center line with a width of several μm is formed. For example, when this color synthesis prism is applied to a head-mounted display, the center line is more easily visually recognized since the pixel size is small and the focus position and the center line are close to each other because of a small size of the display panel for the head-mounted display.

In contrast, the Philips prism and the gapless prism have a configuration different from that of the cross dichroic prism, and a plurality of prisms are joined to each other at flat surfaces. This configuration does not cause the problem of the center line that is visually recognized in an image. However, the Philips prism and the gapless prism have a larger size and a longer optical path length of the prism than the cross dichroic prism. Consequently, when the Philips prism or the gapless prism is used as the color synthesis element, the image light generation device including the plurality of display elements and the color synthesis element becomes larger and the image display device becomes larger.

SUMMARY

To solve the above problem, an image light generation device of one aspect of the present disclosure includes a first display element configured to emit a first color light, a second display element configured to emit a second color light having a color different from a color of the first color light, a third display element configured to emit a third color light having a color different from the color of the first color light and the color of the second color light, and a color synthesis element configured to generate synthetic light obtained by synthesizing the first color light emitted from the first display element, the second color light emitted from the second display element, and the third color light emitted from the third display element. The color synthesis element includes a first prism including a first incident surface on which the first color light is incident and an emission surface from which the synthetic light is emitted, a second prism including a second incident surface on which the second color light is incident, a third prism including a third incident surface on which the third color light is incident, a first dichroic film configured to reflect the first color light and transmit the second color light and the third color light, and a second dichroic film configured to reflect the second color light and transmit the third color light. The first prism and the second prism are joined to each other through the first dichroic film with no air layer between the first prism and the second prism, the second prism and the third prism are joined to each other through the second dichroic film with no air layer between the second prism and the third prism, and a main light beam incidence angle of the third color light with respect to the second dichroic film is greater than or equal to 40 degrees.

In the image light generation device of one aspect of the present disclosure, the main light beam incidence angle of the third color light with respect to the second dichroic film may be smaller than or equal to 55 degrees.

In the image light generation device of one aspect of the present disclosure, a main light beam incidence angle of the first color light with respect to the first dichroic film may be greater than or equal to 25 degrees and less than 45 degrees.

In the image light generation device of one aspect of the present disclosure, the first incident surface and the second incident surface may be located on a same side with respect to an illumination light axis along an emission direction of the synthetic light.

In the image light generation device of one aspect of the present disclosure, the first incident surface and the second incident surface may be located on different sides with respect to an illumination light axis along an emission direction of the synthetic light.

In the image light generation device of one aspect of the present disclosure, the first color light may be green light, the second color light may be one of blue light and red light, and the third color light may be the other of the blue light and the red light.

In the image light generation device of one aspect of the present disclosure, each of the first display element, the second display element, and the third display element may include an organic electroluminescence element.

In the image light generation device of one aspect of the present disclosure, the organic electroluminescence element may include an optical resonator.

In the image light generation device of one aspect of the present disclosure, a pixel size of the first display element, the second display element, and the third display element may be smaller than or equal to 10 μm.

An image display device according to an aspect of the present disclosure may include the image light generation device according to one aspect of the present disclosure.

DESCRIPTION OF EXEMPLARY EMBODIMENTS

First Embodiment

A first embodiment of the present disclosure is described below with reference to FIGS. 1 to 4.

Figure 1:
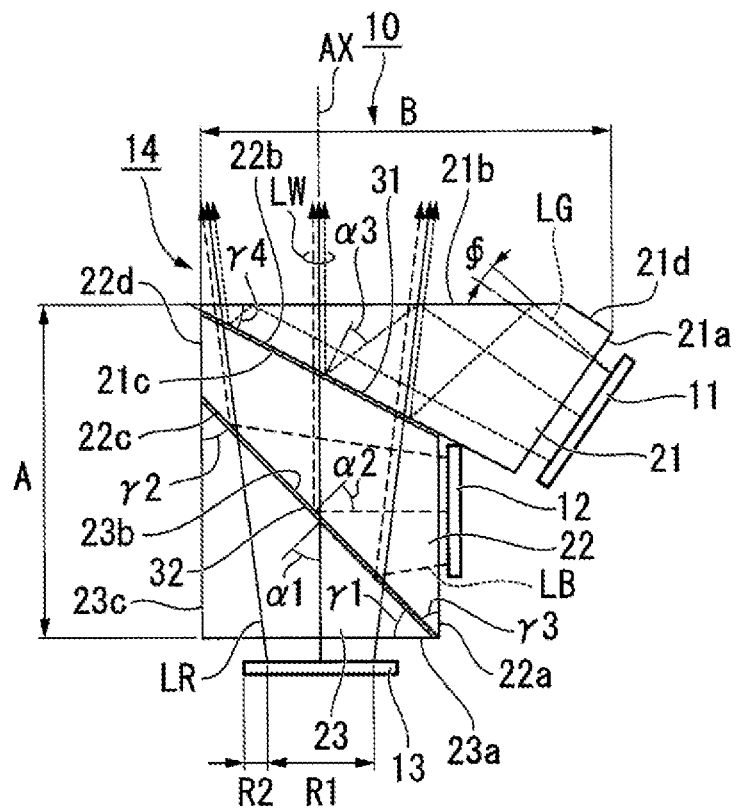
FIG. 1 is a plan view of an image light generation device of a first embodiment.

FIG. 1 is a plan view illustrating an image light generation device of the first embodiment.

Note that, in the drawings, some components may not be drawn to scale for ease of illustration of the components.

As illustrated in FIG. 1, an image light generation device 10 of this embodiment includes a first display element 11, a second display element 12, a third display element 13, and a color synthesis element 14. The color synthesis element 14 is composed of a so-called gapless prism in which three prisms are joined to each other with no air layer therebetween.

The first display element 11 emits green light LG (first color light). The second display element 12 emits blue light LB (second color light) having a color different from the green light LG. The third display element 13 emits red light LR (third color light) having a color different from the green light LG and the blue light LB. The color synthesis element 14 generates synthetic light LW obtained by synthesizing the green light LG emitted from the first display element 11, the blue light LB emitted from the second display element 12, and the red light LR emitted from the third display element 13.

The first display element 11, the second display element 12, and the third display element 13 have substantially the same configuration except for the difference in the colors of the emission light. Each of the first display element 11, the second display element 12, and the third display element 13 includes a display region R1 in which a plurality of pixels are arranged in a matrix, and a non-display region R2 surrounding the display region R1. The size of the pixel is, for example, 10 μm or smaller. A light emitting element is provided in each of the plurality of pixels. The light emitting element is composed of a top-emitting organic electroluminescence (EL) element. In other words, each of the first display element 11, the second display element 12, and the third display element 13 is composed of an organic EL panel.

Figure 2:
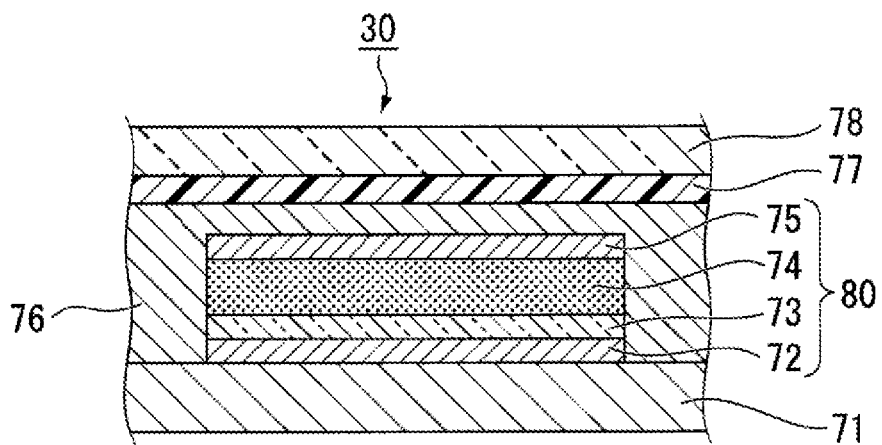
FIG. 2 is a diagram schematically illustrating a configuration of an organic EL element.

FIG. 2 is a diagram schematically illustrating a configuration of an organic EL element 30.

As illustrated in FIG. 2, a reflective electrode 72, an anode 73, a light-emitting functional layer 74, and a cathode 75 are provided on one surface of a substrate 71 in order from the substrate 71 side. The substrate 71 is composed of a semiconductor material such as silicon, for example. The reflective electrode 72 is composed of a light-reflective conductive material such as aluminum and silver, for example. More specifically, the reflective electrode 72 may be composed of a single material such as aluminum and silver, or may be composed of a laminated film of titanium (Ti)/AlCu (aluminum copper alloy), or the like.

The anode 73 is composed of a conductive material having optical transparency, such as indium tin oxide (ITO), for example. Although not illustrated in the drawing, the light-emitting functional layer 74 is composed of a plurality of layers including a light-emitting layer including an organic EL material, a hole injecting layer, an electron injecting layer, and the like. The light-emitting layer is composed of known organic EL materials for red, green and blue emission colors.

The cathode 75 functions as a semi-transmissive reflective layer having a property (semi-transmissive reflective property) that allows part of light to pass therethrough while reflecting the remaining part of the light. For example, the cathode 75 having the semi-transmissive reflective property can be achieved by forming a light-reflective conductive material, such as an alloy containing silver or magnesium, into a sufficiently thin film thickness. The light emitted from the light-emitting functional layer 74 reciprocates between the reflective electrode 72 and the cathode 75 such that a component of a specific resonance wavelength is selectively amplified, and the light is transmitted through the cathode 75 and emitted to the observation side (the side opposite to the substrate 71). In other words, an optical resonator 80 is composed of the plurality of layers from the reflective electrode 72 to the cathode 75.

The plurality of layers from the reflective electrode 72 to the cathode 75 are covered by a sealing film 76. The sealing film 76 is a film for preventing entry of air and moisture, and is composed of a single layer or a plurality of layers of an inorganic material or an organic material having optical transparency. A color filter 77 is provided on one surface of the sealing film 76. In the first display element 11, the color filter 77 is composed of a light-absorbing filter layer that absorbs light of a wavelength range other than the green wavelength range and transmits light of the green wavelength range. Likewise, in the second display element 12, the color filter 77 is composed of a light-absorbing filter layer that absorbs light of a wavelength range other than the blue wavelength range and transmits light of the blue wavelength range. In the third display element 13, the color filter 77 is composed of a light-absorbing filter layer that absorbs light of a wavelength range other than the green wavelength range and transmits light of the green wavelength range.

A cover glass 78 for protecting each display element is provided on one surface of the color filter 77.

The peak wavelength of the green light LG is, for example, greater than or equal to 495 nm and less than or equal to 570 nm. The peak wavelength of the blue light LB is, for example, greater than or equal to 450 nm and less than or equal to 490 nm. The peak wavelength of the red light LR is, for example, greater than or equal to 630 nm and less than or equal to 680 nm. Each of the green light LG, the blue light LB, and the red light LR does not have a polarization property. In other words, each of the green light LG, the blue light LB and the red light LR is unpolarized light that does not have a specific oscillation direction. Note that the unpolarized light, i.e., light that does not have a polarization property, is light that is not in a completely unpolarized state and includes a certain amount of polarization component, and, has a polarization in a range, such as a polarization of 20% or smaller, that does not actively have an influence on the optical property for the dichroic film, for example.

Each of the green light LG, the blue light LB, and the red light LR emitted from display elements 11, 12 and 13 is emitted at an emission angle φ of 7 degrees with respect to the normal direction to the emission surface of each display element, for example. FIG. 1 illustrates, in addition to the main light beams of the color light LG, the color light LB, and the color light LR emitted from the display elements 11, 12 and 13, light beams expanding outward by 7 degrees from both ends of the display region R1 of each of the display elements 11, 12 and 13. For this reason, the acceptance angle of the optical element such as the dichroic film and the prism into which the color light LG, the color light LB, and the color light LR enter needs to be 7 degrees.

The color synthesis element 14 includes a first prism 21, a second prism 22, a third prism 23, a first dichroic film 31, and a second dichroic film 32.

The first prism 21 is composed of a light-transmissive member having a quadrangular columnar shape. The first prism 21 includes a first incident surface 21a that faces the first display element 11 and allows incidence of the green light LG emitted from the first display element 11, an emission surface 21b that emits the synthetic light LW, a first surface 21c that is in contact with the first dichroic film 31, and a second surface 21d located between the first incident surface 21a and the emission surface 21b.

The second prism 22 is composed of a light-transmissive member having a quadrangular columnar shape. The second prism 22 includes a second incident surface 22a that faces the second display element 12 and allows incidence of the blue light LB emitted from the second display element 12, a third surface 22b that is in contact with the first dichroic film 31, a fourth surface 22c that is in contact with the second dichroic film 32, and a fifth surface 22d located between the third surface 22b and the fourth surface 22c.

The third prism 23 is composed of a light-transmissive member having a triangular columnar shape. The third prism 23 includes a third incident surface 23a that faces the third display element 13 and allows incidence of the red light LR emitted from the third display element 13, a sixth surface 23b that is in contact with the second dichroic film 32, and a seventh surface 23c located between the third incident surface 23a and the sixth surface 23b.

The first dichroic film 31 reflects the green light LG and allows the blue light LB and the red light LR to pass therethrough. The first dichroic film 31 is composed of a dielectric multilayer film.

The second dichroic film 32 reflects the blue light LB and allows the red light LR to pass therethrough. The second dichroic film 32 is composed of a dielectric multilayer film.

The first prism 21 and the second prism 22 are joined to each other through the first dichroic film 31 with no air layer therebetween such that the first surface 21c and the third surface 22b face each other. The second prism 22 and the third prism 23 are joined to each other through the second dichroic film 32 with no air layer therebetween such that the fourth surface 22c and the sixth surface 23b face each other.

Specifically, the first prism 21 and the second prism 22 are joined to each other by an adhesive layer (not illustrated) having optical transparency. The first dichroic film 31 may be formed on the first surface 21c, or may be formed on the third surface 22b. The second prism 22 and the third prism 23 are joined to each other by an adhesive layer (not illustrated) having optical transparency. The second dichroic film 32 may be formed on the fourth surface 22c, or may be formed on the sixth surface 23b.

In this embodiment, the first incident surface 21a of the first prism 21 and the second incident surface 22a of the second prism 22 are located on the same side with respect to an illumination light axis Ax along the emission direction of the synthetic light LW. In other words, the first display element 11 and the second display element 12 are located on the same side with respect to the illumination light axis Ax along the emission direction of the synthetic light LW. Note that in the present specification, the illumination light axis Ax is defined as an optical axis along the emission direction of the synthetic light LW emitted from the emission surface 21b of the color synthesis element 14, i.e., an optical axis along the main light beam of the synthetic light LW.

A main light beam incidence angle α1 of the red light LR with respect to the second dichroic film 32 is greater than or equal to 40 degrees and smaller than or equal to 55 degrees. The shapes of the third prism 23 and the second prism 22 are set such that the main light beam incidence angle α1 satisfies the above-described angle conditions. In this embodiment, the main light beam incidence angle α1 of the red light LR with respect to the second dichroic film 32 is 45 degrees. Here, in the third prism 23, an angle γ1 between the third incident surface 23a and the sixth surface 23b is 45 degrees, and an angle γ2 between the sixth surface 23b and the seventh surface 23c is 45 degrees. In other words, the third prism 23 is a right-angle isosceles triangular prism. In addition, a main light beam incidence angle α2 of the blue light LB with respect to the second dichroic film 32 is 45 degrees. Here, in the second prism 22, an angle γ3 between the second incident surface 22a and the fourth surface 22c is 45 degrees.

Note that in the present specification, the main light beam incidence angle is an angle between the main light beam of color light emitted from the center of the display element toward the dichroic film and the normal to the dichroic film passing through the incident point of the main light beam on the dichroic film.

Note that while the size of the color synthesis element 14 can be minimized when the main light beam incidence angle α1 of the red light LR with respect to the second dichroic film 32 is set to 45 degrees, the effect of miniaturization of the color synthesis element 14 is reduced when the main light beam incidence angle α1 of the red light LR is less than 40 degrees or greater than 55 degrees. When the maximum acceptance angle is assumed to be 10 degrees, the upper limit of the main light beam incidence angle α1 of the red light LR is desirably 55 degrees.

A main light beam incidence angle α3 of the green light LG with respect to the first dichroic film 31 is greater than or equal to 25 degrees and less than 45 degrees. The shapes of the first prism 21 and the second prism 22 are set such that the main light beam incidence angle α3 satisfies the above-described angle conditions. In this embodiment, the main light beam incidence angle α3 of the green light LG with respect to the first dichroic film 31 is 27.7 degrees. Here, in the first prism 21, an angle γ4 between the emission surface 21b and the first surface 21c is 27.7 degrees.

Note that the total reflection condition in the first prism 21 is not satisfied when the main light beam incidence angle α3 of the green light LG is less than 25 degrees, and the configuration in which the green light LG emitted from the first display element 11 is totally reflected once at the emission surface 21b is not achieved when the main light beam incidence angle α3 of the green light LG is greater than or equal to 45 degrees.

Figure 3:
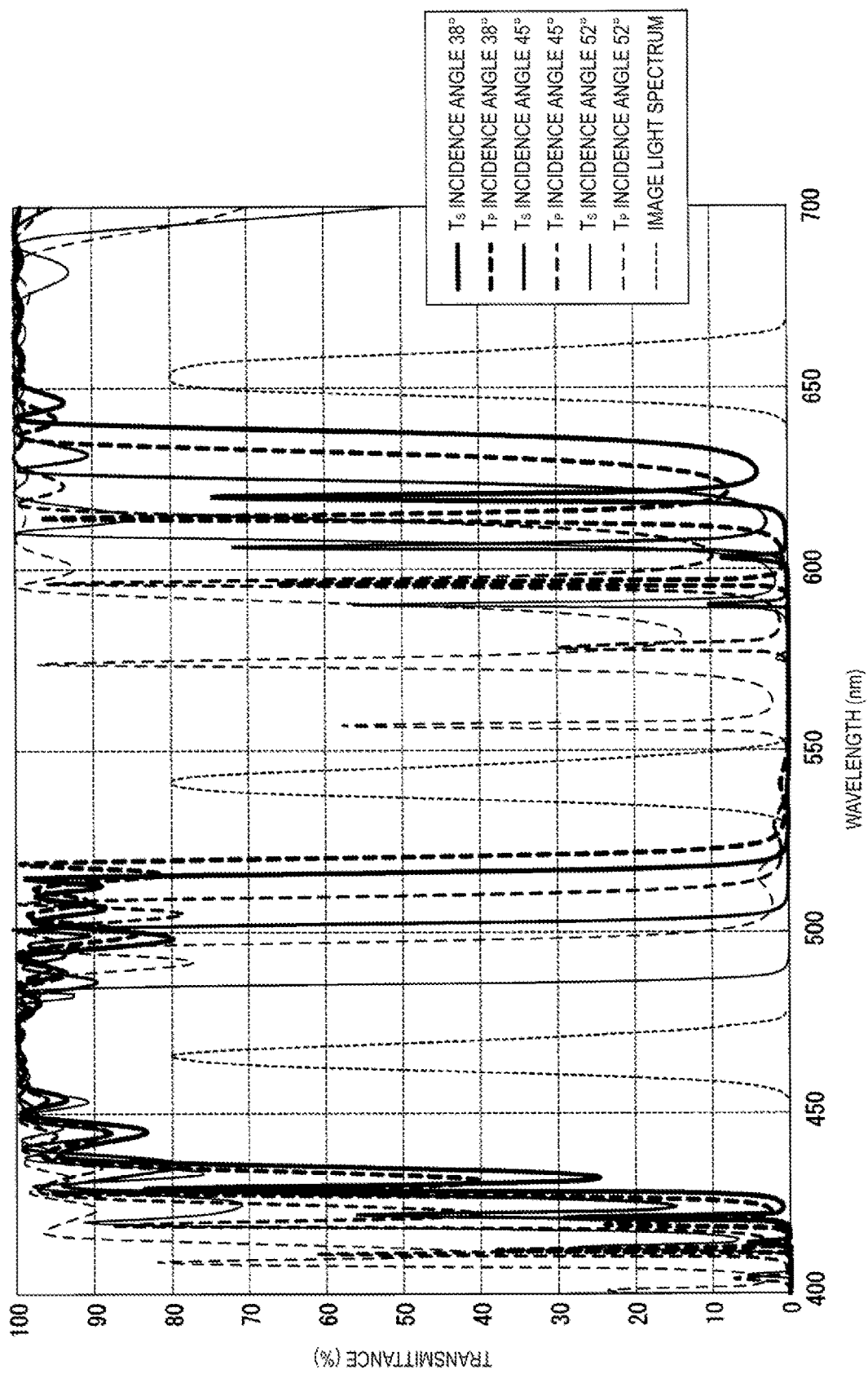
FIG. 3 is a graph showing an example of a spectral property of a first dichroic film.

FIG. 3 is a graph showing an example of a spectral property of the first dichroic film 31.

In FIG. 3, the horizontal axis indicates a wavelength (nm), and the vertical axis indicates a transmittance (%). FIG. 3 shows spectral properties of S-polarized light and P-polarized light with respect to the first dichroic film 31, at incidence angles of 38, 45, and 52 degrees. Ts represents a transmittance of S-polarized light, and Tp represents a transmittance of P-polarized light. FIG. 3 also shows spectra of the blue light LB, the green light LG, and the red light LR emitted from the organic EL elements of the display elements 11, 12 and 13.

As shown in FIG. 3, the transmittance at 470 nm, which is the peak wavelength of the blue light LB, is approximately 100% in both the S-polarized light and the P-polarized light at all incidence angles. In addition, the transmittance at 660 nm, which is the peak wavelength of the red light LR, is approximately 100% in both the S-polarized light and the P-polarized light at all incidence angles. In contrast, the transmittance at 540 nm, which is the peak wavelength of the green light LG, is approximately 0% in both the S-polarized light and the P-polarized light at all incidence angles. In other words, the reflectivity at 540 nm, which is the peak wavelength of the green light LG, is approximately 100% in both the S-polarized light and the P-polarized light at all incidence angles.

Figure 4:
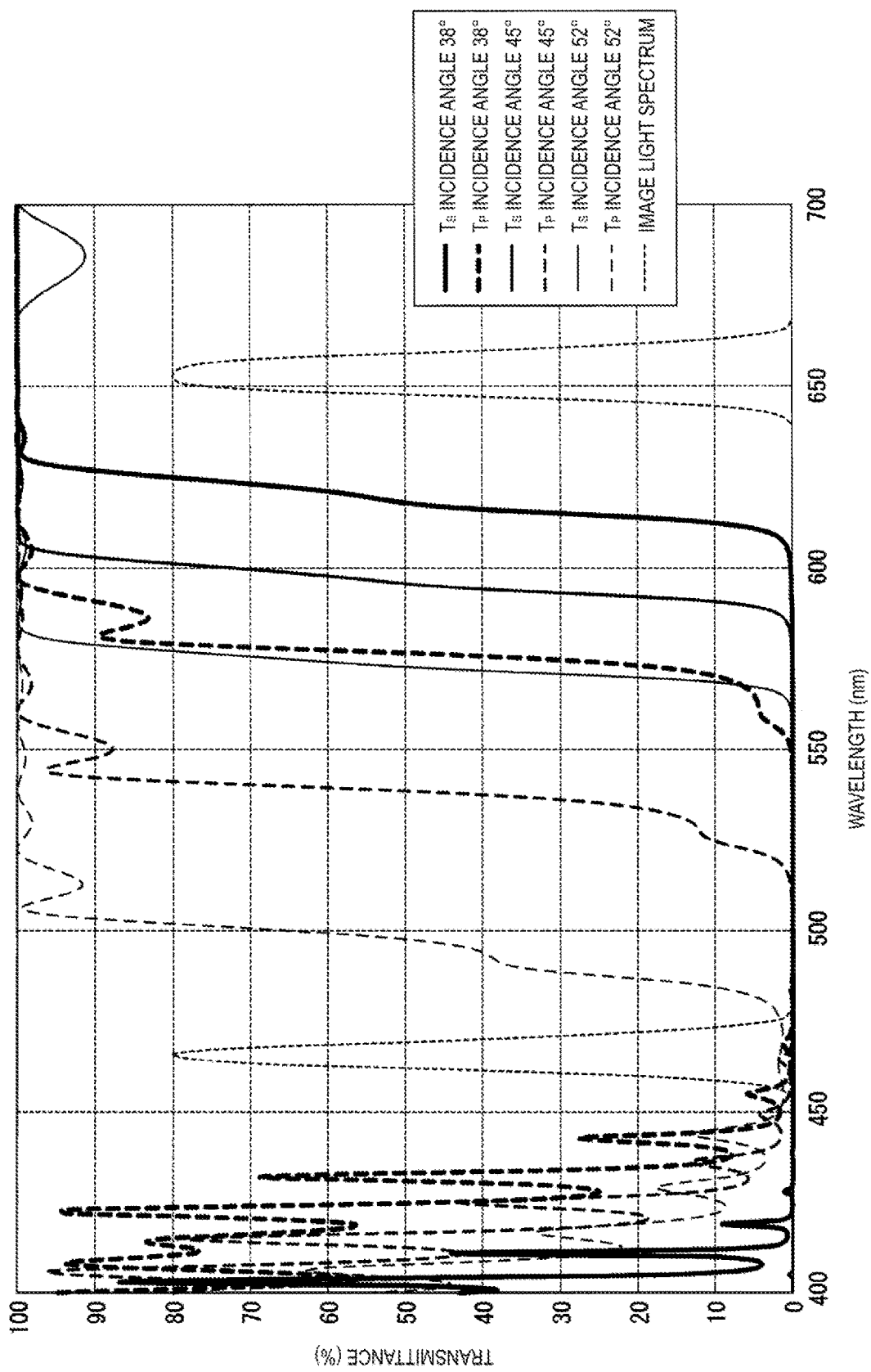
FIG. 4 is a graph showing an example of a spectral property of a second dichroic film.

FIG. 4 is a graph showing an example of a spectral property of the second dichroic film 32.

In FIG. 4, the horizontal axis indicates a wavelength (nm), and the vertical axis indicates a transmittance (%). FIG. 4 shows spectral properties of S-polarized light and P-polarized light with respect to the second dichroic film 32, at incidence angles of 38, 45, and 52 degrees. Ts represents a transmittance of S-polarized light, and Tp represents a transmittance of P-polarized light. FIG. 4 also shows spectra of the blue light LB and the red light LR incident on the second dichroic film 32.

As shown in FIG. 4, the transmittance at 470 nm, which is the peak wavelength of the blue light LB, is approximately 0% in both the S-polarized light and the P-polarized light at all incidence angles. In other words, the reflectance at 470 nm, which is the peak wavelength of the blue light LB, is approximately 100% in both the S-polarized light and the P-polarized light at all incidence angles. In contrast, the transmittance at 660 nm, which is the peak wavelength of the red light LR, is approximately 100% in both the S-polarized light and the P-polarized light at all incidence angles.

In general, in the case where only light of a particular polarization state impinges on the dichroic film as in a color synthesis element that synthesizes light emitted from a liquid crystal panel, it is relatively easy to design a dielectric multilayer film such that light of a certain wavelength range is reflected while light of another wavelength range is transmitted. In contrast, in the case where unpolarized light impinges on the dichroic film as in a color synthesis element that synthesizes light emitted from the organic EL panel, it is difficult to design a dielectric multilayer film such that light of a certain wavelength range is reflected while light of another wavelength range is transmitted. However, as shown in FIGS. 3 and 4, the inventor of the present disclosure confirmed that the first dichroic film 31 and the second dichroic film 32 that satisfy the specifications of this embodiment can be practically achieved.

Especially in this embodiment, each of the first display element 11, the second display element 12, and the third display element 13 includes the optical resonator, and thus, through resonance of the light at the resonance wavelengths, light whose wavelength range is narrowed is emitted. As a result, with respect to the transmittance or the reflectivity of the light in each wavelength range, the margin of spectral property variation associated with changes in incidence angle increases. Thus, the color unevenness of the image can be suppressed and the ease of the design of the dielectric multilayer film can be increased.

Now, assuming that an image light generation device of a comparative example is provided, the size of the color synthesis element is compared between the image light generation device of this embodiment and the image light generation device of the comparative example. Note that it is assumed that the display element has the same size in this embodiment and the comparative example. In addition, regarding the dimension of the color synthesis element, a dimension in a direction parallel to the emission direction of the synthetic light is defined as a dimension A, and a dimension in a direction perpendicular to the emission direction of the synthetic light is defined as a dimension B.

It is assumed that the optical path lengths of blue light, green light, and red light are set to identical when designing the color synthesis element.

First Comparative Example

Figure 9:
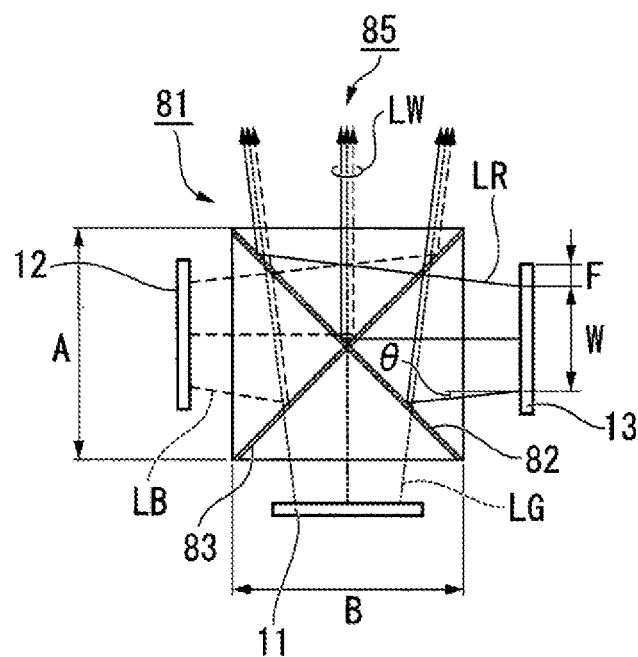
FIG. 9 is a plan view illustrating an image light generation device of a first comparative example.

FIG. 9 is a plan view illustrating an image light generation device 85 of a first comparative example.

Note that in FIG. 9, the components common to FIG. 1 are denoted with the same reference symbols, and the description thereof is omitted.

As illustrated in FIG. 9, a color synthesis element 81 is composed of a cross dichroic prism. In the case of the cross dichroic prism, the main light beam incidence angle of each of the color light LG, the color light LB, and the color light LR is 45 degrees with respect to each of dichroic films 82 and 83. Therefore, the optical path length and the outer size of the prism are equal to each other. When the optical path length (outer size) of the prism is represented by L, the width of the display region (emission light) of the display elements 11, 12 and 13 is represented by W, the width of the non-display region around the display region is represented by F, and the acceptance angle is represented by θ, the optical path length L of the prism is expressed by the following equation (1).

$$L=(W+F)/(1-2 \cdot \tan \theta) \quad (1)$$

Here, for example, when the width of the display region is set to W=4 mm, the width of the non-display region is set to F=1 mm and the acceptance angle is set to θ=7 degrees as an image light generation device for use in a small image display device such as a head-mounted display, the optical path length of the prism is L=8 mm. In other words, the dimension A and the dimension B of the color synthesis element 81 are both 8 mm.

In the above-described manner, according to the first comparative example, the color synthesis element 81 having a small size can be achieved. However, as described earlier, the problem of a center line formed in an image due to the joining portion at the center of the prism is unavoidable. In addition, when the main light beam incidence angle is 45 degrees, the incidence angle dependency and polarization dependency of the spectral property of the dichroic films 82 and 83 are large, and consequently it is difficult to design the dielectric multilayer film for unpolarized light.

Second Comparative Example

Figure 10:
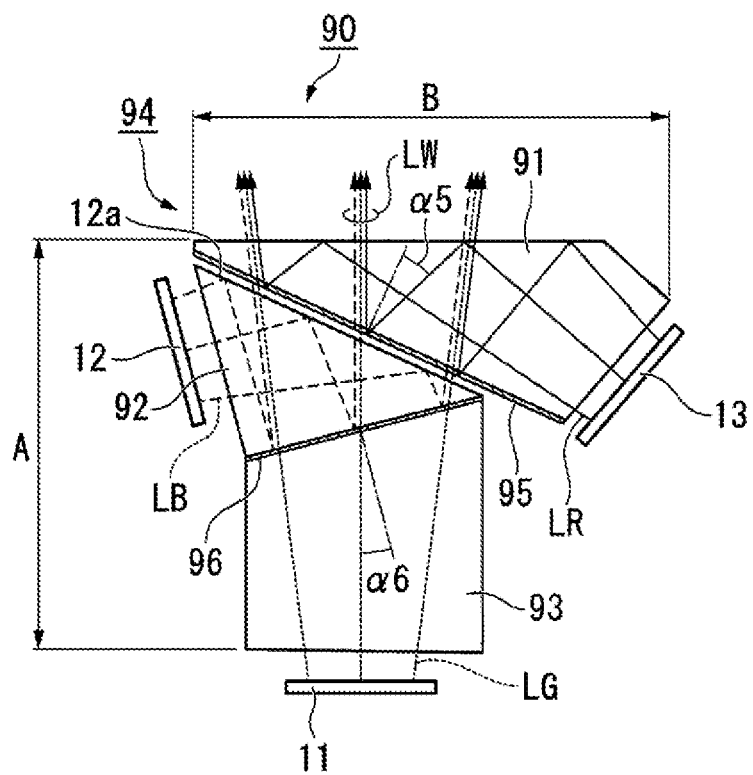
FIG. 10 is a plan view illustrating an image light generation device of a second comparative example.

FIG. 10 is a plan view illustrating an image light generation device 90 of a second comparative example.

Note that, in FIG. 10, the components common to FIG. 1 are denoted with the same reference symbols, and the description thereof is omitted.

As illustrated in FIG. 10, a color synthesis element 94 of the second comparative example is composed of a Philips prism and includes a first prism 91, a second prism 92, and a third prism 93. In the case of the Philips prism, an air layer is interposed between the first prism 91 and the second prism 92. Therefore, the reflection at the first surface 22a of the blue light LB emitted from the second display element 12 is total reflection at the interface between the air and the medium of the prism. In this manner, in the case of the Philips prism, the shape and size of each prism are determined so as to satisfy the total reflection conditions since total reflection is used for reflection of part of the light.

Since the Philips prism does not have a joining portion at the center of the prism, the problem of the center line of the cross dichroic prism is resolved. In addition, a main light beam incidence angle $\alpha 5$ of the red light LR with respect to a first dichroic film 95 is 24.5 degrees. A main light beam incidence angle $\alpha 6$ of the green light LG with respect to a second dichroic film 96 is 13 degrees. Thus, the incidence angle dependency and polarization dependency of the spectral property of each of the dichroic films 95 and 96 are small, and it is easy to design the dielectric multilayer film for unpolarized light. However, the optical path length is 22 mm, which is greater than the optical path length of the color synthesis element 81 of the first comparative example illustrated in FIG. 9. As a result, with the dimension A of 22 mm and the dimension B of 26 mm, the size of the color synthesis element 94 is much larger than the color synthesis element 81 of the first comparative example.

This Embodiment

In contrast, as described above, the color synthesis element 14 of this embodiment illustrated in FIG. 1 is composed of a gapless prism. Since the gapless prism does not include the joining portion at the center of the prism as in the Philips prism, the problem of the center line of the cross dichroic prism is resolved. The main light beam incidence angle $\alpha 3$ of the green light LG with respect to the first dichroic film 31 is 27.7 degrees, and the main light beam incidence angle $\alpha 1$ of the red light LR with respect to the second dichroic film 32 is 45 degrees. In this case, a dielectric multilayer film for unpolarized light can be designed as described above with reference to FIGS. 3 and 4.

In this embodiment, in particular, the main light beam incidence angle $\alpha 1$ with respect to the second dichroic film 32 is 45 degrees, which is greater than the main light beam incidence angle $\alpha 6$ of 13 degrees with respect to the second dichroic film 96 in the color synthesis element 94 of the second comparative example illustrated in FIG. 10. As a result, the optical path length of the color synthesis element 14 is 12.5 mm, and the optical path length can be shortened compared to the color synthesis element 94 of the second comparative example. As a result, with the dimension A of 12.5 mm and the dimension B of 14 mm, the size of the color synthesis element 14 is sufficiently small compared to the color synthesis element 94 of the second comparative example.

In this manner, with the configuration of this embodiment, the size of the color synthesis element 14 can be reduced, and thus the image light generation device 10 having a smaller size can be provided without causing a reduction in the visibility of the image due to the center line.

The image light generation device 10 of this embodiment has a configuration in which the green light LG enters the first prism 21, and includes the first dichroic film 31 that reflects the green light LG and transmits the blue light LB and the red light LR, and the second dichroic film 32 that reflects the blue light LB and transmits the red light LR. In this manner, as shown in FIG. 4, the wavelength range of switching between reflection and transmission in the second dichroic film 32 can be widely set in the entirety of the green light band. Thus, the second dichroic film 32 can be easily designed.

Second Embodiment

A second embodiment of the present disclosure is described below with reference to FIG. 5.

The basic configuration of an image light generation device of the second embodiment is similar to that of the first embodiment, but the configuration of the second display element differs from that of the first embodiment. Therefore, description of the overall configuration of the image light generation device is omitted.

Figure 5:
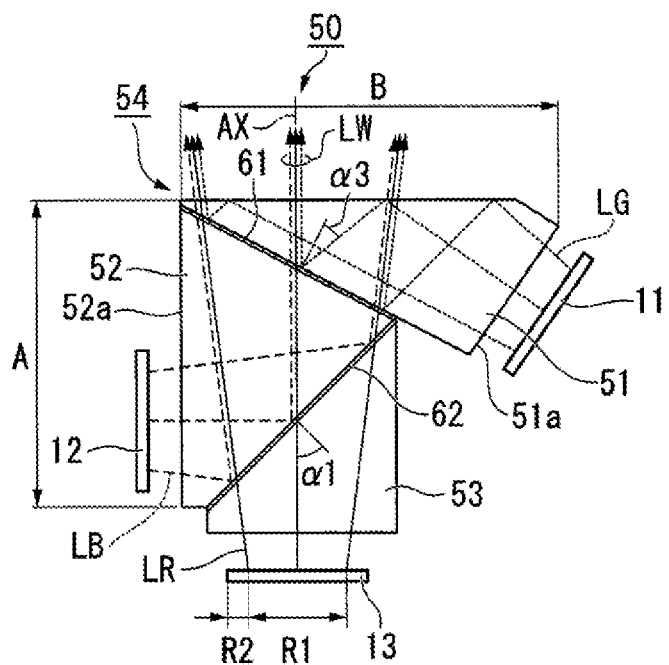
FIG. 5 is a plan view of an image light generation device of a second embodiment.

FIG. 5 is a plan view of the image light generation device according to this embodiment.

In FIG. 5, the components common to those of the drawings used in the first embodiment are denoted with the same reference symbols, and the description thereof is omitted.

As illustrated in FIG. 5, the image light generation device 50 of this embodiment includes the first display element 11, the second display element 12, the third display element 13, and a color synthesis element 54.

The color synthesis element 54 includes a first prism 51, a second prism 52, a third prism 53, a first dichroic film 61, and a second dichroic film 62.

In this embodiment, unlike in the first embodiment, a first incident surface 51a of the first prism 51 and a second incident surface 52a of the second prism 52 are located on different sides with respect to the illumination light axis Ax along the emission direction of the synthetic light LW. In other words, the first display element 11 and the second display element 12 are located on different sides with respect to the illumination light axis Ax along the emission direction of the synthetic light LW.

With the above-described differences in the configuration, the shapes and sizes of the first prism 51, the second prism 52, and the third prism 53 of this embodiment differ from the shapes and sizes of the first prism 21, the second prism 22, and the third prism 23 of the first embodiment. The color synthesis element 54 has a dimension A of 13 mm, and a dimension B of 14.8 mm. In this manner, the size of the color synthesis element 54 is slightly larger than the color synthesis element 14 of the first embodiment.

In addition, as in the first embodiment, the main light beam incidence angle $\alpha 1$ of the red light LR with respect to the second dichroic film 62 is 45 degrees. In addition, the main light beam incidence angle $\alpha 3$ of the green light LG with respect to the first dichroic film 61 is 27.7 degrees.

This embodiment can also achieve the effects similar to those of the first embodiment, i.e., the image light generation device 50 having a small size can be provided without causing a reduction in the visibility of the image due to the center line.

In the image light generation device 10 of the first embodiment, the second display element 12 is disposed in a space having an acute corner formed by the first surface 21*c* of the first prism 21 and the second incident surface 22*a* of the second prism 22 as illustrated in FIG. 1. Therefore, if the width of the non-display region R2 of the organic EL panel constituting the second display element 12 is excessively wide, the second display element 12 may interfere with the first prism 21, and the second display element 12 may be difficult to place. Note that in order to reduce the risk of the interference of the second display element 12 with the first prism 51, the housing of the second display element 12 may be smaller than the housing of the first display element 11 and the third display element 13.

In contrast, in the image light generation device 50 of this embodiment, the second display element 12 is disposed at a surface on the side where the first prism 51 does not protrude, i.e., the second incident surface 52*a* of the second prism 52 as illustrated in FIG. 5. Therefore, even when the non-display region R2 of the organic EL panel has some large width, the risk of the interference of the second display element 12 with the first prism 51 is small, and the degree of freedom of the design of the organic EL panel can be increased.

In both the first embodiment and the second embodiment, when the organic EL panel constituting each of the display elements 11, 12 and 13 has a rectangular shape, each of the display elements 11, 12 and 13 may be disposed in an orientation in which the short side of the organic EL panel is parallel to the paper plane of FIGS. 1 and 5, or may be disposed in an orientation in which the long side of the organic EL panel is parallel to the paper plane of FIGS. 1 and 5. However, in order to reduce the size of the image light generation devices 10 and 50, the arrangement of the orientation in which the short side of the organic EL panel is parallel to the paper plane of FIGS. 1 and 5 is preferable.

Third Embodiment

A third embodiment of the present disclosure is described below with reference to FIGS. 6 and 7.

The image light generation devices described in the first embodiment and the second embodiment are used in a display device described below.

Figure 6:
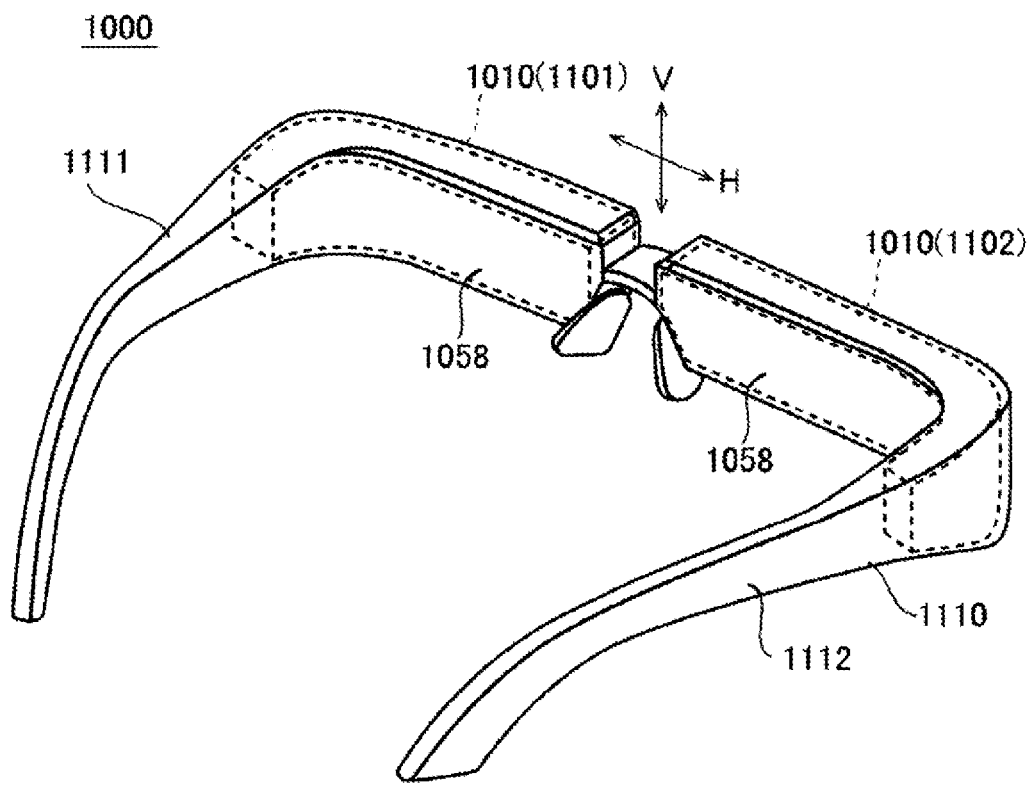
FIG. 6 is a diagram schematically illustrating a configuration of a head-mounted display device of a third embodiment.

FIG. 6 is an explanatory diagram illustrating a head-mounted display device 1000 of the third embodiment. FIG. 7 is a diagram illustrating optical paths of an optical system of a virtual image display part 1010 illustrated in FIG. 6.

As illustrated in FIG. 6, the head-mounted display device 1000 (image display device) is configured as a see-through type eyeglass display, and includes a frame 1110 provided with left and right temples 1111 and 1112. In the head-mounted display device 1000, with the virtual image display part 1010 supported by the frame 1110, a user can recognize an image emitted from the virtual image display part 1010 as a virtual image. In this embodiment, the head-mounted display device 1000 includes a left-eye display part 1101 and a right-eye display part 1102 as the virtual display part 1010. The left-eye display part 1101 and the right-eye display part 1102 have the same configuration, and are symmetrically disposed in the left-right direction.

In the following description, the left-eye display part 1101 is mainly described, and the description of the right-eye display part 1102 is omitted.

Figure 7:
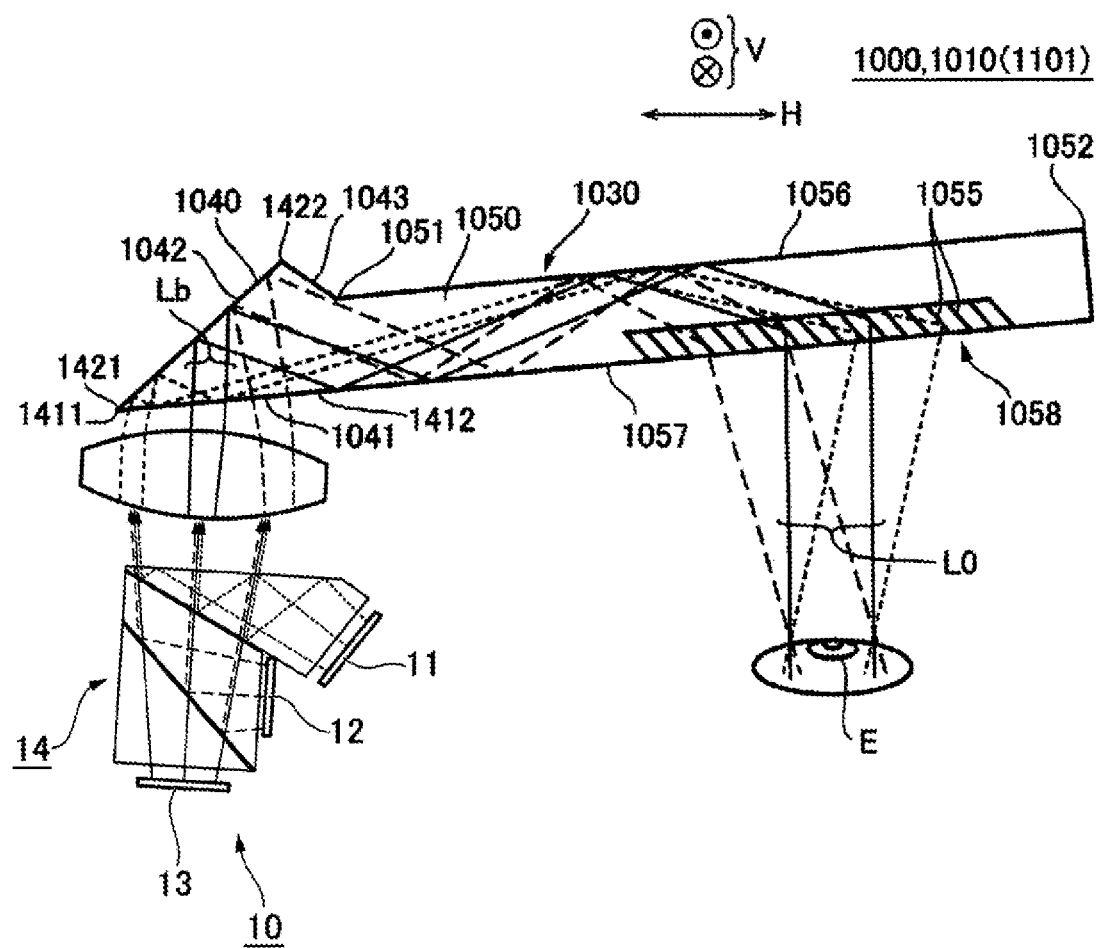
FIG. 7 is a schematic view illustrating optical paths of an optical system of the head-mounted display device.

As illustrated in FIG. 7, in the head-mounted display device 1000, the left-eye display part 1101 includes the image light generation device 10, and a light-guiding system 1030 that guides, to an emission part 1058, synthetic light Lb emitted from the image light generation device 10. A projection optical system 1070 is disposed between the image light generation device 10 and the light-guiding system 1030, and the synthetic light Lb emitted from the image light generation device 10 enters the light-guiding system 1030 through the projection optical system 1070. The projection optical system 1070 is composed of a single collimate lens having a positive power.

The image light generation device 10 includes the color synthesis element 14 and three display elements 11, 12 and 13 disposed opposite three incident surfaces of a plurality of surfaces of the color synthesis element 14. The display elements 11, 12 and 13 are composed of, for example, organic EL panels.

Light emitted from the first display element 11 enters the color synthesis element 14 as the green light LG. Light emitted from the second display element 12 enters the color synthesis element 14 as the blue light LB. Light emitted from the third display element 13 enters the color synthesis element 14 as the red light LR. The synthetic light Lb obtained by synthesizing the green light LG, the blue light LB, and the red light LR is emitted from the color synthesis element 14. In this embodiment, the green light LG, the blue light LB, and red light LR are so-called unpolarized light that do not have any specific polarization property.

The light-guiding system 1030 includes a light-transmissive incident part 1040 from which the synthetic light Lb enters, and a light-transmissive light-guiding part 1050 whose one end 1051 side is coupled to the incident part 1040. In this embodiment, the incident part 1040 and the light-guiding part 1050 are composed of an integrated light-transmissive member.

The incident part 1040 includes an incident surface 1041 on which the synthetic light Lb emitted from the image light generation device is incident, and a reflection surface 1042 that reflects, between the reflection surface 1042 and the incident surface 1041, the synthetic light Lb that has entered from the incident surface 1041. The incident surface 1041 is composed of a flat surface, an aspherical surface, a free form surface or the like, and faces the image light generation device 10 through the projection optical system 1070. The projection optical system 1070 is obliquely disposed such that the distance from an end portion 1412 of the incident surface 1041 is larger than the distance from an end portion 1411 of the incident surface 1041.

Although no reflection film is formed at the incident surface 1041, the incident surface 1041 totally reflects incident light whose incidence angle is equal to or greater than the critical angle. As such, the incident surface 1041 has a light transmissive property and a light reflecting property. The reflection surface 1042 is composed of a surface that faces the incident surface 1041, and is obliquely disposed such that an end portion 1422 is located further away from the incident surface 1041 than an end portion 1421 of the incident surface 1041. As such, the incident part 1040 has a substantially triangular shape. The reflection surface 1042 is composed of a flat surface, an aspherical surface, a free form surface or the like. The reflection surface 1042 has a configuration in which a reflective metal layer mainly made of aluminum, silver, magnesium, chrome and the like is formed.

The light-guiding part 1050 includes a first surface 1056 (first reflection surface) that extends from the one end 1051 toward the other end 1052 side, a second surface 1057 (second reflection surface) that faces the first surface 1056 in a parallel manner and extends from the one end 1051 side toward the other end 1052 side, and an emission part 1058 provided in a part of apart from the incident part 1040 in the second surface 1057. The first surface 1056 and the reflection surface 1042 of the incident part 1040 are coupled together with a slope surface 1043 therebetween. The thickness of the first surface 1056 and the second surface 1057 is smaller than the incident part 1040. The first surface 1056 and the second surface 1057 totally reflect the incident light whose incidence angle is equal to or greater than the critical angle on the basis of a refractive index difference between the light-guiding part 1050 and the outside (air). As such, no reflection film is formed at the first surface 1056 and the second surface 1057.

The emission part 1058 is formed in a part on the second surface 1057 side in the thickness direction in the light-guiding part 1050. In the emission part 1058, a plurality of partial reflection surfaces 1055 obliquely tilted with respect to the normal direction to the second surface 1057 are arranged parallel to each other. The emission part 1058 is a part that overlaps the plurality of partial reflection surfaces 1055 in the second surface 1057, and is a region that has a predetermined width in an extending direction of the light-guiding part 1050. Each of the plurality of partial reflection surfaces 1055 is composed of a dielectric multilayer film.

In addition, at least one of the plurality of partial reflection surfaces 1055 may be a composite layer including a dielectric multilayer film and a reflective metal layer (thin film) mainly made of aluminum, silver, magnesium, chrome and the like. When the partial reflection surface 1055 includes a metal layer, it is possible to obtain an effect of enhancing the reflectance of the partial reflection surface 1055, or an effect of optimizing the incidence angle dependency and/or the polarization dependency of the transmittance and reflectance of the partial reflection surface 1055. Note that the emission part 1058 may have a configuration in which an optical element such as a diffraction grating and a hologram is provided.

In the display device 1000 having the above-described configuration, the synthetic light Lb composed of parallel light incident on the incident part 1040 is refracted at the incident surface 1041 and travels toward the reflection surface 1042. Next, the synthetic light Lb is reflected at the reflection surface 1042, and again travels toward the incident surface 1041. At this time, since the synthetic light Lb impinges on the incident surface 1041 at an incidence angle equal to or greater than the critical angle, the synthetic light Lb is reflected at the incident surface 1041 toward the light-guiding part 1050, and travels toward the light-guiding part 1050. Note that while the incident part 1040 is configured such that the synthetic light Lb composed of parallel light impinges on the incident surface 1041, it is also possible to employ a configuration in which the incident surface 1041 and the reflection surface 1042 are composed of free-form curves and the like such that the synthetic light Lb composed of non-parallel light incident on the incident surface 1041 is converted into parallel light through reflection between the reflection surface 1042 and the incident surface 1041.

In the light-guiding part 1050, the synthetic light Lb travels while being reflected between the first surface 1056 and the second surface 1057. Part of the synthetic light Lb incident on the partial reflection surface 1055 is reflected at the partial reflection surface 1055 and emitted from the emission part 1058 toward an eye E of an observer. In addition, the remaining part of the synthetic light Lb incident on the partial reflection surface 1055 passes through the partial reflection surface 1055 and impinges on the next adjacent partial reflection surface 1055. Thus, the synthetic light Lb reflected at each of the plurality of partial reflection surfaces 1055 is emitted from the emission part 1058 toward the eye E of the observer. In this manner, the observer can recognize a virtual image.

At this time, the light that impinges on the light-guiding part 1050 from the outside passes through the partial reflection surfaces 1055 after entering the light-guiding part 1050, and reaches the eye E of the observer. Thus, the observer can see a color image emitted from the image light generation device and can see the scenery of the outside world and the like in a see-through manner.

The head-mounted display device 1000 according to this embodiment includes the image light generation device 10 of the first embodiment, and therefore provides excellent display quality while achieving miniaturization. Note that the head-mounted display device 1000 may include the image light generation device 50 of the second embodiment. In addition, instead of the configuration of this embodiment, the image light generation device 10 of the first embodiment or the image light generation device 50 of the second embodiment may be applied to a head-mounted display device provided with an optical system that does not use the light-guiding system 1030.

Fourth Embodiment

A fourth embodiment of the present disclosure is described below with reference to FIG. 8.

The image light generation devices described in the first embodiment and the second embodiment are used in an image display device described below.

Figure 8:
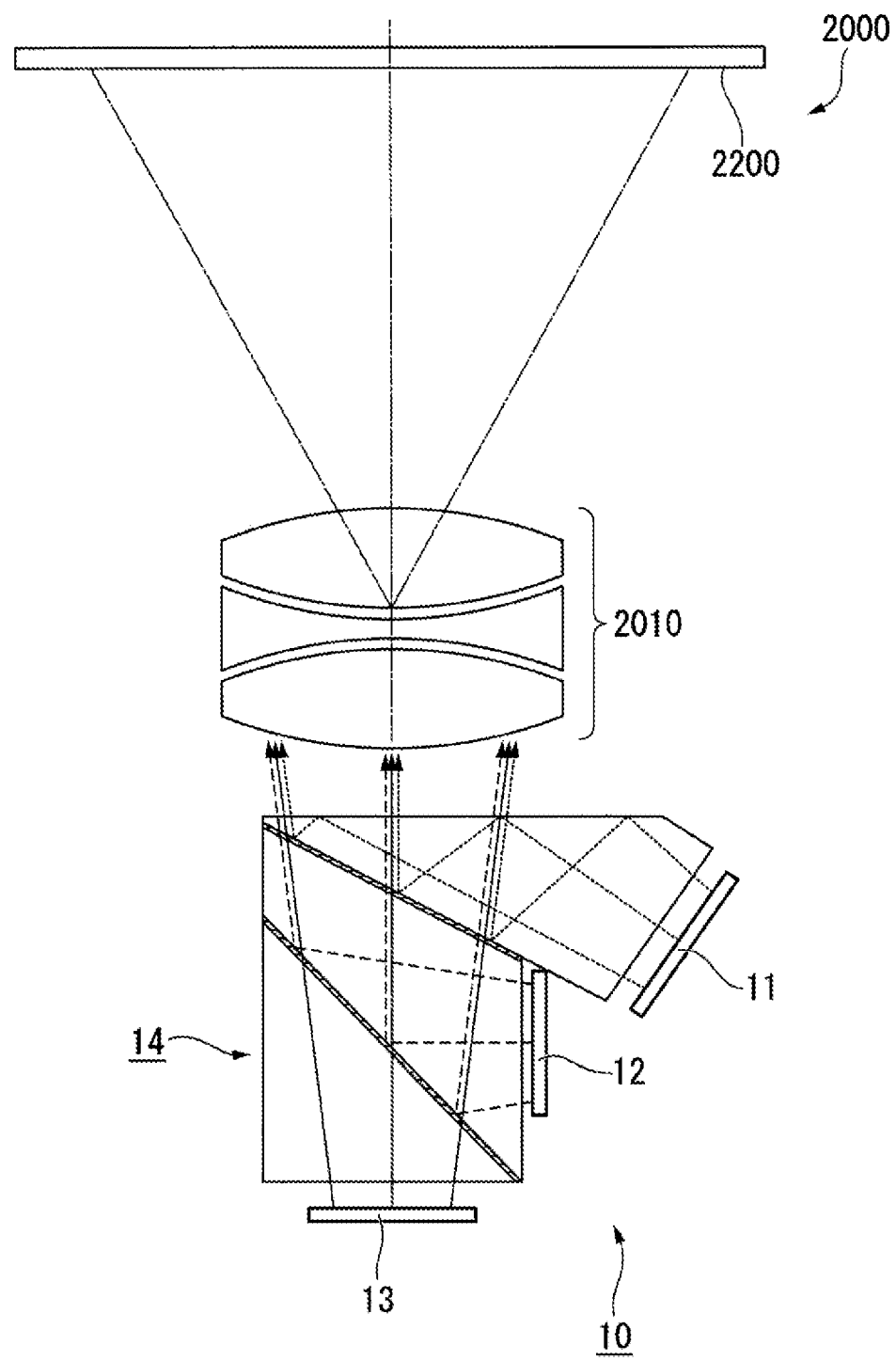
FIG. 8 is a diagram schematically illustrating a configuration of a projection-type display device of a fourth embodiment.

FIG. 8 is a diagram schematically illustrating a configuration of a projection-type display device 2000 of the fourth embodiment.

As illustrated in FIG. 8, the projection-type display device 2000 (image display device) includes the image light generation device 10, and a projection optical system 2100 that expands and projects the synthetic light Lb emitted from the image light generation device 10 to a projection target member 2200 such as a screen.

The image light generation device 10 includes the color synthesis element 14 and three display elements 11, 12 and 13 disposed opposite three incident surfaces of a plurality of surfaces of the color synthesis element 14. The display elements 11, 12 and 13 are composed of, for example, organic EL panels.

The projection-type display device 2000 of the fourth embodiment includes the image light generation device 10 of the first embodiment, and therefore provides excellent display quality while achieving miniaturization. Note that the projection-type display apparatus 2000 may include the image light generation device 50 of the second embodiment.

Note that the technical scope of the present disclosure is not limited to the above-described embodiments, and various modifications can be made to the above-described embodiments without departing from the spirit and gist of the present disclosure.

For example, an example is described in the embodiments in which an organic EL panel that emits blue light and an organic EL panel that emits red light are used as the second display element and the third display element, respectively. Alternatively, it is also possible to use an organic EL panel that emits red light and an organic EL panel that emits blue light as the second display element and the third display element, respectively. In addition, in the embodiments, by using the organic EL panel that emits green light as the first display element, the effect of increasing the ease of the design of the second dichroic film is achieved as described above. However, if this effect is not required, an organic EL panel that emits blue light or red light may be used as the first display element.

Further, specific configurations, such as the material, number, arrangement, and shape, of each component of the image light generation device and the image display device exemplified in the embodiments may be appropriately modified.

In addition, while an example is described in the embodiments in which the display element composed of an organic EL panel and a color synthesis element are combined as the image light generation device, the display element is not limited to the organic EL panel, and a self-emitting panel such as an inorganic EL panel and a micro LED panel may also be used. In addition, an image display panel such as a liquid crystal panel that emits image light having a polarization property may also be used instead of the self-emitting panel that emits image light that does not have a polarization property.

In addition, examples of the image display device including the image display module described in the above-described embodiments include an electronic view finder (EVF) used in an image-capturing apparatus such as a video camera and a still camera.

What is claimed is:

1. An image light generation device comprising:
    a first display element configured to emit a first color light;
    a second display element configured to emit a second color light having a color different from a color of the first color light;
    a third display element configured to emit a third color light having a color different from the color of the first color light and the color of the second color light; and
    a color synthesis element configured to generate synthetic light obtained by synthesizing the first color light emitted from the first display element, the second color light emitted from the second display element, and the third color light emitted from the third display element,
    wherein the color synthesis element includes:
    a first prism including a first incident surface on which the first color light is incident and an emission surface from which the synthetic light is emitted,
    a second prism including a second incident surface on which the second color light is incident,
    a third prism including a third incident surface on which the third color light is incident,
    a first dichroic film configured to reflect the first color light and transmit the second color light and the third color light, and
    a second dichroic film configured to reflect the second color light and transmit the third color light,
    the first prism and the second prism are joined to each other through the first dichroic film with no air layer between the first prism and the second prism,
    the second prism and the third prism are joined to each other through the second dichroic film with no air layer between the second prism and the third prism, and
    a main light beam incidence angle of the third color light with respect to the second dichroic film is greater than or equal to 40 degrees, wherein the first incident surface and the second incident surface are located on a same side with respect to an illumination light axis along an emission direction of the synthetic light.

2. The image light generation device according to claim 1, wherein the first color light is green light, the second color light is one of blue light and red light, and the third color light is the other of the blue light and the red light.

3. The image light generation device according to claim 1, wherein a main light beam incidence angle of the first color light with respect to the first dichroic film is greater than or equal to 25 degrees and less than 45 degrees.

4. The image light generation device according to claim 1, wherein the main light beam incidence angle of the third color light with respect to the second dichroic film is smaller than or equal to 55 degrees.

5. The image light generation device according to claim 1, wherein a pixel size of each of the first display element, the second display element, and the third display element is smaller than or equal to 10 μm.

6. An image display device comprising the image light generation device according to claim 1.

7. The image light generation device according to claim 1, wherein each of the first display element, the second display element, and the third display element includes an organic electroluminescence element.

8. The image light generation device according to claim 7, wherein the organic electroluminescence element includes an optical resonator.

9. An image light generation device comprising:
    a first display element configured to emit a first color light;
    a second display element configured to emit a second color light having a color different from a color of the first color light;
    a third display element configured to emit a third color light having a color different from the color of the first color light and the color of the second color light; and
    a color synthesis element configured to generate synthetic light obtained by synthesizing the first color light emitted from the first display element, the second color light emitted from the second display element, and the third color light emitted from the third display element,
    wherein the color synthesis element includes:
    a first prism including a first incident surface on which the first color light is incident and an emission surface from which the synthetic light is emitted,
    a second prism including a second incident surface on which the second color light is incident,
    a third prism including a third incident surface on which the third color light is incident,
    a first dichroic film configured to reflect the first color light and transmit the second color light and the third color light, and
    a second dichroic film configured to reflect the second color light and transmit the third color light,
    the first prism and the second prism are joined to each other through the first dichroic film with no air layer between the first prism and the second prism,
    the second prism and the third prism are joined to each other through the second dichroic film with no air layer between the second prism and the third prism, and a main light beam incidence angle of the third color light with respect to the second dichroic film is greater than or equal to 40 degrees, wherein the first incident surface and the second incident surface are located on different sides with respect to an illumination light axis along an emission direction of the synthetic light.

* * * * *